(12) United States Patent
Fischer et al.

(10) Patent No.: US 8,278,919 B2
(45) Date of Patent: Oct. 2, 2012

(54) MEMS OSCILLATING MAGNETIC SENSOR AND METHOD OF MAKING

(75) Inventors: Gregory Alexander Fischer, Laurel, MD (US); Jonathan Elliott Fine, Silver Spring, MD (US); Alan Shane Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 164 days.

(21) Appl. No.: 12/854,321

(22) Filed: Aug. 11, 2010

(65) Prior Publication Data

US 2012/0206134 A1    Aug. 16, 2012

(51) Int. Cl.
*G01R 33/02* (2006.01)
*G01R 33/07* (2006.01)
*G01B 7/30* (2006.01)

(52) U.S. Cl. ............... 324/244; 324/207.2; 324/207.21
(58) Field of Classification Search .................. 324/244, 324/207.2, 207.21
See application file for complete search history.

(56) References Cited

U.S. PATENT DOCUMENTS

| | | | |
|---|---|---|---|
| 4,322,709 A | 3/1982 | Vonder et al. | |
| 4,587,509 A | 5/1986 | Pitt et al. | |
| 4,864,237 A | 9/1989 | Hoenig | |
| 5,180,970 A | 1/1993 | Ross | |
| 5,942,895 A | 8/1999 | Popovic | |
| 5,998,995 A | 12/1999 | Osiander et al. | |
| 6,175,229 B1 | 1/2001 | Becker et al. | |
| 6,275,034 B1 | 8/2001 | Tran et al. | |
| 6,337,027 B1 | 1/2002 | Humphrey | |
| 6,442,011 B1 | 8/2002 | Attarian | |
| 6,501,268 B1 | 12/2002 | Edelstein et al. | |
| 6,566,786 B2 | 5/2003 | Nguyen | |
| 6,570,373 B1 | 5/2003 | Viola | |
| 6,577,040 B2 | 6/2003 | Nguyen | |
| 6,593,831 B2 | 7/2003 | Nguyen | |
| 6,660,252 B2 | 12/2003 | Matathia et al. | |
| 6,670,809 B1 | 12/2003 | Edelstein et al. | |
| 6,713,938 B2 | 3/2004 | Nguyen | |
| 6,838,304 B2 | 1/2005 | Ikeda et al. | |

(Continued)

FOREIGN PATENT DOCUMENTS

| JP | 2006-205352 | 8/2006 |
|---|---|---|
| JP | 2008-030182 | 2/2008 |
| WO | WO/2004/038354 | 6/2004 |

OTHER PUBLICATIONS

Guedes, et al. "Hybrid magnetoresistive/microelectronnechanical devices for static field modulation and sensor 1/f noise cancellation," Journal of Applied Physics 103, 07E924 (2008).

(Continued)

*Primary Examiner* — Bot Ledynh
(74) *Attorney, Agent, or Firm* — Lawrence E. Anderson

(57) ABSTRACT

A microelectromechanical system (MEMS) device for sensing a magnetic field comprising: a base; a cantilever attached to the base structure at a first end and movable at a second end, the second end oscillating at a predetermined frequency upon application of a current; a magnetic sensor attached to the movable second end; at least one flux concentrator mounted on the base adapted to transfer magnetic flux to the sensor; whereby when the current is applied, the oscillation of the cantilever causes the sensor to oscillate between the lines of flux transferred from the at least one flux concentrator resulting in the shift of the frequency of the sensed magnetic field to the predetermined frequency. The invention further comprises a method of making the MEMS device.

14 Claims, 11 Drawing Sheets

U.S. PATENT DOCUMENTS

| | | |
|---|---|---|
| 6,861,277 B1 | 3/2005 | Monroe et al. |
| 6,946,315 B2 | 9/2005 | Ikeda et al. |
| 7,046,002 B1 | 5/2006 | Edelstein |
| 7,178,378 B2 | 2/2007 | Crawley et al. |
| 7,185,541 B1 | 3/2007 | Edelstein |
| 7,195,945 B1 | 3/2007 | Edelstein |
| 7,358,724 B2 | 4/2008 | Taylor et al. |
| 7,655,996 B1 | 2/2010 | Edelstein |
| 2005/0005676 A1 | 1/2005 | Crawley et al. |
| 2007/0164736 A1 | 7/2007 | Joisten et al. |
| 2010/0039106 A1 | 2/2010 | Edelstein et al. |
| 2010/0045141 A1 | 2/2010 | Pulskamp et al. |
| 2010/0045142 A1 | 2/2010 | Pulskamp et al. |

OTHER PUBLICATIONS

Smith et al., "Very High Sensitivity GMR Spin-Valve Magnetometer," IEEE Trans. Magn. 33, p. 3385 (1997).

U.S. Appl. No. 12/365,398 entitled "Magnetic Sensor Method and Apparatus," filed Feb. 4, 2009, to Edelstein, et al.

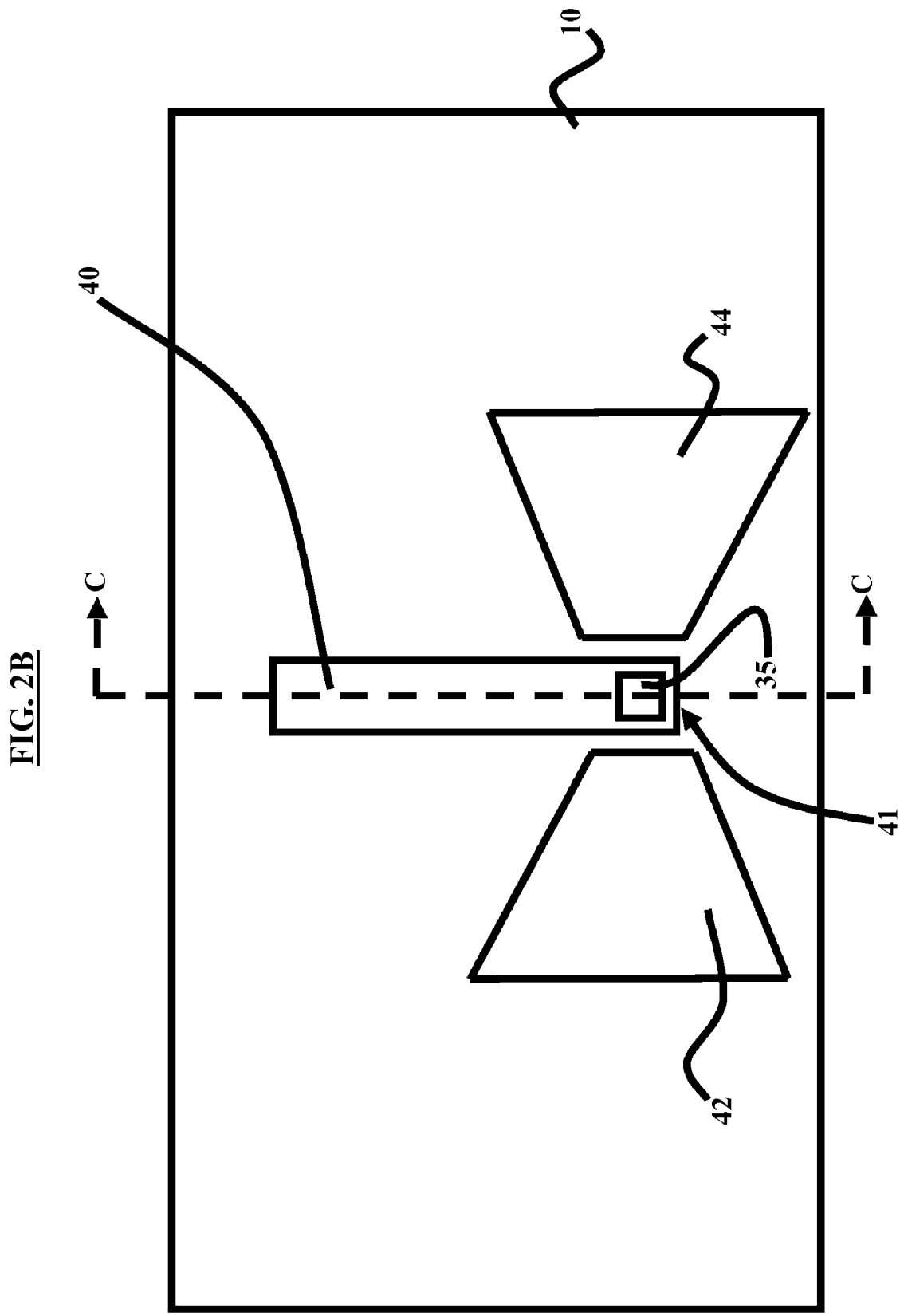

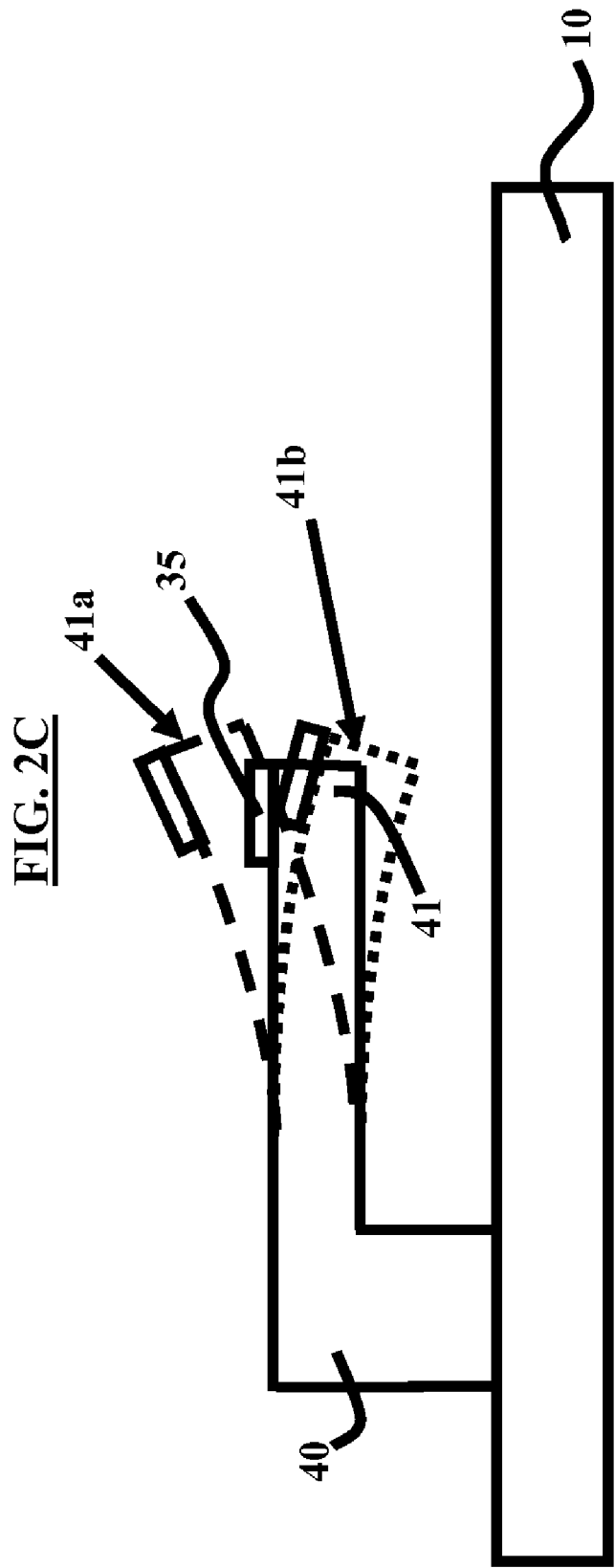

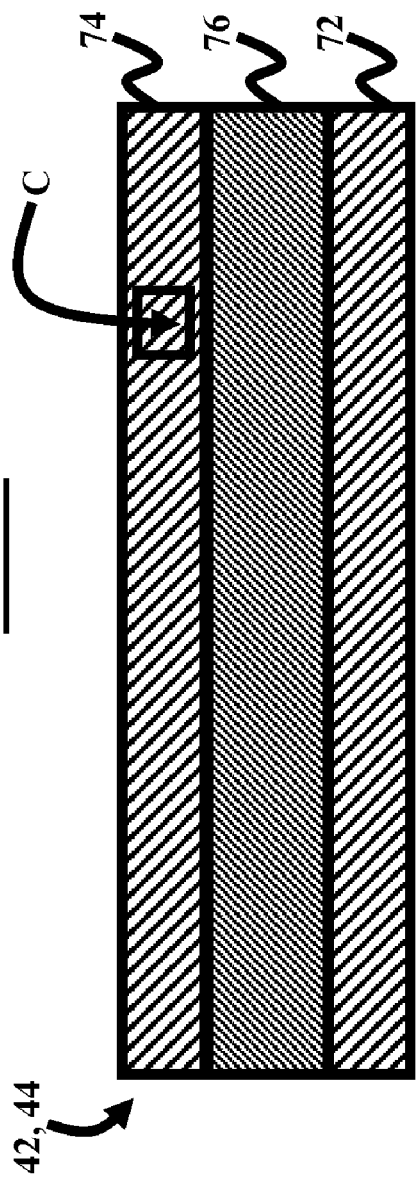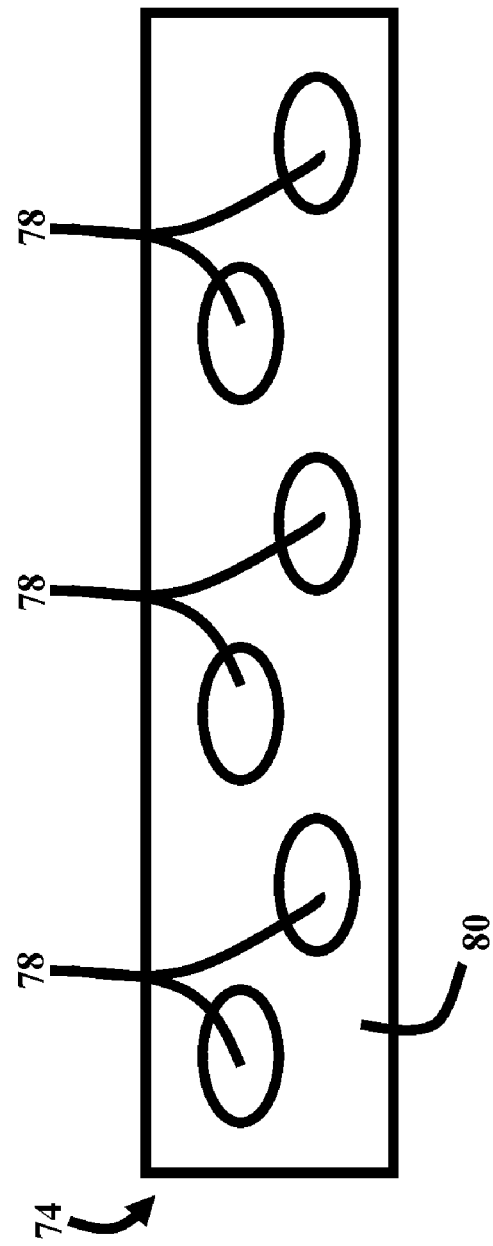

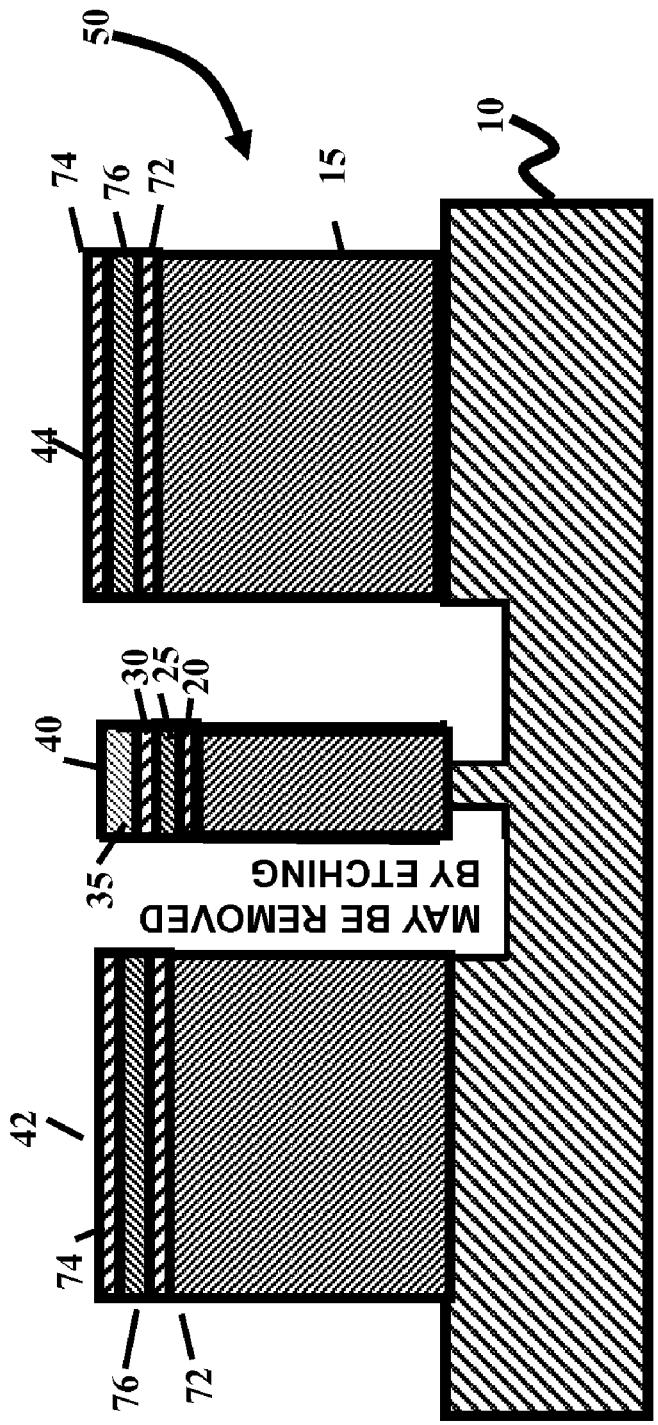

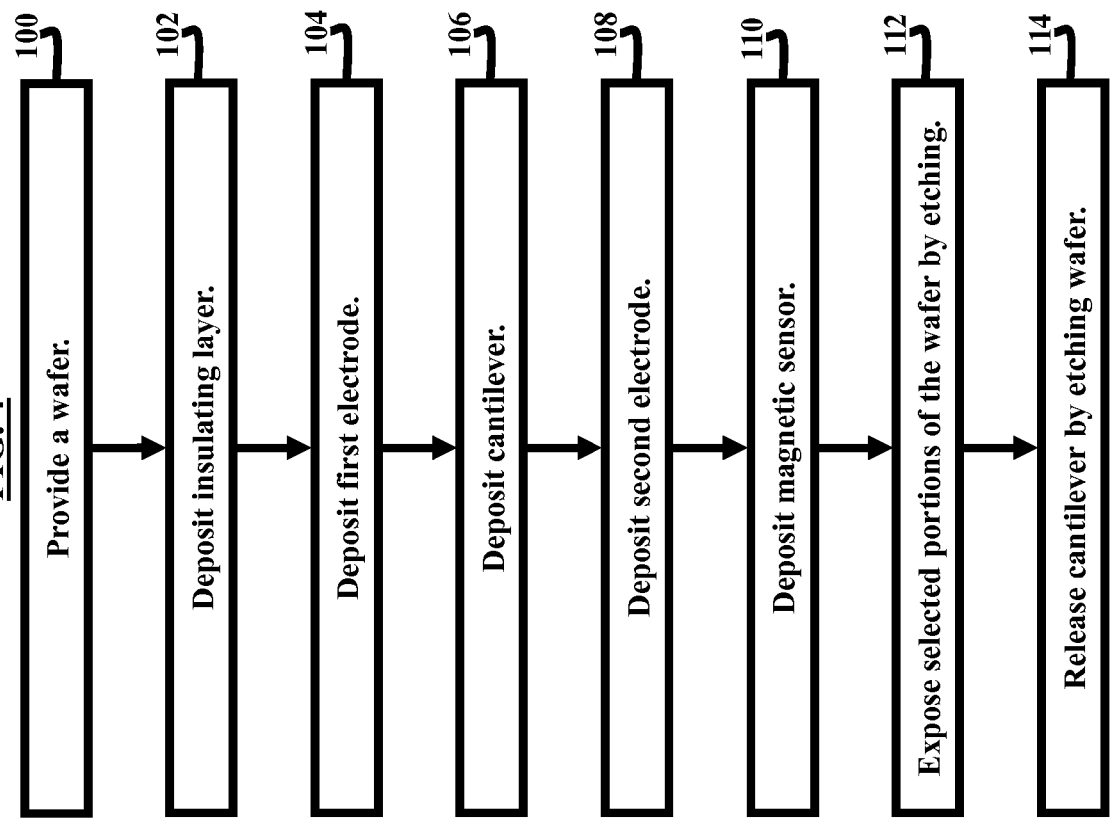

MEMS OSCILLATING MAGNETIC SENSOR AND METHOD OF MAKING

GOVERNMENT INTEREST

The embodiments herein may be manufactured, used, and/or licensed by or for the United States Government without the payment of royalties thereon.

BACKGROUND OF THE INVENTION

Generally, most high sensitivity magnetic sensors used to measure magnetic field strength do not reach their full potential. The sensing technique utilized by high sensitivity magnetic sensors is typically hampered by noise constraints. A main component of this noise is "1/f noise," also known as Flicker noise, which is a signal or process with a frequency spectrum that lessens at higher frequencies. Pink noise patterns are also referred to as "1/f noise," and are found in semiconductors, music melodies, atomic clocks, and in nature, including the sounds of wind and waterfalls. 1/f noise occurs in almost all electronic devices, and results from a variety of effects. For applications where detection of low frequency phenomena is critical, 1/f noise is a major problem. Thus, there is a need to mitigate the effect of 1/f noise.

Interest is increasing in the development of miniature sensors for sensing magnetic fields, such as, for example, extraterrestrial, industrial, biomedical, oceanographic, and environmental applications. The trend in magnetic sensor design and development is toward smaller size, lower power consumption, and lower cost for similar or improved performance.

Currently, several types of magnetometers, which are magnetic sensors with external instrumentation, are in use. The least expensive and least sensitive devices have a resolution of approximately 10-1 Oersted (Oe)/Hz1/2 and typically are Hall-effect devices. These devices operate by sensing a voltage change across a conductor or semiconductor placed in a magnetic field. However, such devices generally do not lend themselves for applications requiring greater sensitivity, such as required, for example, in brain scan devices and magnetic anomaly detection devices.

Flux gate magnetometers are more sensitive than Hall-effect devices; having a resolution of approximately 10-6 Oe/Hz1/2. Flux gate magnetometers use a magnetic core surrounded by an electromagnetic coil, and are generally difficult to micro-fabricate. Additionally, flux gate magnetometers typically require a relatively large amount of power and accordingly do not lend themselves to a low-cost, compact, portable design. Another way of increasing the sensed magnetic field by a magnetic sensor is by use of a flux concentrator, which can enhance a sensed magnetic field by factor of 1.5 to as much as 100. Flux concentrators are described further in U.S. application Ser. No. 12/536,213 filed Aug. 5, 2009, entitled "MEMS DEVICE WITH SUPPLEMENTAL FLUX CONCENTRATOR," and U.S. application Ser. No. 12/541,805, filed Aug. 14, 2009, entitled "MEMS DEVICE WITH TANDEM FLUX CONCENTRATORS AND METHOD OF MODULATING FLUX," hereby incorporated by reference.

A magnetic sensor (magnetometer) which addresses 1/f type noise is taught in Hoenig, U.S. Pat. No. 4,864,237, issued Sep. 5, 1989, the complete disclosure of which is herein incorporated by reference. Hoenig teaches an apparatus for measuring magnetic fields, which change only at extremely low frequency. Hoenig uses a SQUID (superconducting quantum interference detectors) magnetometer, which includes a superconducting flux transformer that inductively couples a detected signal into a DC SQUID sensor. The magnetometer of Hoenig may include a device for modulating the detected signal in a frequency range characteristic of low-noise operation of the SQUID. The modulation frequencies are generally above 1 Hz and optionally even above 1 Khz. However, the limitations of this device, and others like it, include the need for a cryogenic operation, which inherently does not lend to relatively low cost, low power use. Although SQUIDS are more sensitive magnetometers having a resolution of approximately 10-10 Oe/Hz1/2, because SQUIDS include a superconducting element, these apparatus typically must include cooling means at liquid gas temperatures, making them extremely bulky and expensive to operate. Also, their relatively large size generally limits their utility because the active superconducting element cannot be placed directly adjacent to the source of the magnetic field. As such, it is common in magnetic sensors to place the sense element between two stationary flux concentrators to enhance the field. See, for example, U.S. application Ser. No. 12/536,213, filed Aug. 5, 2009, entitled "MEMS DEVICE WITH SUPPLEMENTAL FLUX CONCENTRATOR," and U.S. application Ser. No. 12/541,805, filed Aug. 14, 2009, entitled "MEMS DEVICE WITH TANDEM FLUX CONCENTRATORS AND METHOD OF MODULATING FLUX," hereby incorporated by reference.

Furthermore, magnetic sensors used to detect objects that move slowly typically possess considerably low frequency 1/f-type noise, which is an unwanted condition. Generally, there is a tendency for such devices, which have higher sensitivity, to also exhibit higher 1/f-type noise. This type of noise generally occurs when using magnetoresistive-type magnetic sensors.

Another problem arising with magnetic sensor usage occurs when detecting change in a signal due to the influence of a magnetic field. The signal change may be small relative to a background signal or signals; referred to herein as the "DC offset." For example, in spin valve giant magnetoresistor sensors, the change is approximately 5-10%. For anisotropic magnetoresistance sensors the measurable change is even smaller. Extracting the measured signal from the DC offset requires using carefully constructed bridges and other techniques. A way of increasing the magnetic field is by use of a flux concentrator, which can enhance a sensed magnetic field by as much as a factor of 50. See e.g., N. Smith et al., IEEE Trans. Magn. 33, p. 3358 (1997), the complete disclosure of which is herein incorporated by reference. An example of such a device is taught in Popovic et al., U.S. Pat. No. 5,942,895, issued Aug. 24, 1999, entitled "Magnetic field sensor and current and/or energy sensor," the complete disclosure of which is herein incorporated by reference, which teaches the use of Hall effect sensors with flux concentrator components.

U.S. Pat. No. 7,185,541, issued Feb. 2, 2010, hereby incorporated by reference, entitled "MEMS Structure Support and Release Mechanism," discloses a MEMS device and method comprising, inter alia, a MEMS structure adjacent to a SOI base; a sacrificial support operatively connecting the base to the MEMS structure; a suspension member operatively connecting the base to the MEMS structure. An embodiment in U.S. Pat. No. 7,655,996 further comprises a current pulse generator adapted to send a current pulse through the sacrificial support, wherein the current pulse causes the sacrificial support to detach from the MEMS structure.

In U.S. Pat. No. 7,046,002, a flux concentrator system is disclosed wherein the flux concentrators "focus" the magnetic field lines at the sensor location. The flux concentrators are free to move, driven by a comb drive, thus modulating the field at the position of the sensor. When the frequency of oscillation is in the kilohertz range, low frequency signals of interest that are normally obscured by the 1/f noise (which dominates at low frequencies) are effectively shifted to higher frequencies where 1/f noise is significantly lower. The sensor is stationary, the flaps oscillate, and comb drives and silicon springs are required.

BRIEF SUMMARY OF THE INVENTION

A preferred embodiment of the invention comprises a microelectromechanical system (MEMS) device comprising a base structure; a magnetic sensor operatively associated with the base structure and operable for sensing a magnetic field and allowing for a continuous variation of an amplification of the magnetic field at a position at the magnetic sensor. The magnetic sensor is operatively associated with a cantilever which is driven by an AC modulation voltage to provide for oscillation of the magnetic sensor, wherein the AC modulation voltage shifts the operating frequency of the magnetic sensor to increase the operating frequency to eliminate 1/f-type noise, where f is a frequency of operation of the magnetic sensor. At least one flux concentrator is operatively associated with the magnetic sensor Moreover, according to the invention the magnetic sensor comprises one of a Hall effect type sensor, a magnetoresistive sensor, a MEMS sensor, a magneto-diode, a magnetotransistor, a MAGFET, a fluxgate, a miniature fluxgate magnetometer, a SQUID and a magneto-optical sensor. Additionally, each flux concentrator may comprise a layer of a hard magnetic material, a spacer layer, and a layer of a soft magnetic material, wherein the layer of soft magnetic material comprises single domain magnetic particles and a nonmagnetic material, wherein a coercivity of the hard magnetic material is greater than approximately 50 Oersteds and a coercivity of the soft magnetic material is less than approximately 3 Oersteds, and wherein a volume fraction of single domain magnetic particles to nonmagnetic material is less than or equal to approximately fifty percent.

An embodiment of the present invention is directed to a simplified design which reduces fabrication issues and costs, while achieving the desired result of reducing 1/f noise. In a preferred embodiment, the MEMS flux concentrators are stationary relative to the support structure, while the sensor is oscillated. In accordance with a preferred embodiment of the present invention, a cantilever is positioned such that a sensor at its tip is located between the flux concentrators. The cantilever is set to oscillate in the kilohertz range, thus bringing the sensor in and out of the focused (by the flux concentrators) flux lines, resulting in a shifting of the signal of interest into the kilohertz range. Although the kilohertz range is specified, the invention is not limited to the kilohertz range.

A preferred embodiment comprises a microelectromechanical system (MEMS) device comprising a base structure; a cantilever structure comprising a first end attached to the base structure at the first end and an unattached second end opposite of the first end; a magnetic sensor attached to the second end and sensing a magnetic field, allowing for a continuous variation of an amplification of the magnetic field at a position at the magnetic sensor and receiving a DC voltage and an AC modulation voltage in the MEMS device; a pair of stationary platforms coupled to the base structure; and a pair of flux concentrators, wherein each flux concentrator may be stationary and coupled to a corresponding stationary platform.

In such a system, the magnetic sensor may oscillate. Moreover, the magnetic sensor may oscillate in a kilohertz range. In addition, the magnetic sensor may oscillate in and out of flux lines created between the pair of flux concentrators. Furthermore, voltage requirements of the magnetic sensor (in air) may be between 5 and 15 volts. Additionally, the magnetic sensor may optionally be positioned between flux concentrators, such as those disclosed in U.S. application Ser. No. 12/536,213, filed Aug. 5, 2009, entitled "MEMS DEVICE WITH SUPPLEMENTAL FLUX CONCENTRATOR," and U.S. application Ser. No. 12/541,805, filed Aug. 14, 2009, entitled "MEMS DEVICE WITH TANDEM FLUX CONCENTRATORS AND METHOD OF MODULATING FLUX," hereby incorporated by reference. Moreover, the magnetic sensor may oscillate in a kilohertz range and shift a signal of interest concentrated by the flux concentrators into the kilohertz range.

In addition, the magnetic sensor may comprise a Hall-effect type sensor, a magnetoresistive sensor, a MEMS sensor, a magneto-diode, a magneto-transistor, a MAGFET, a fluxgate, a miniature fluxgate magnetometer, a SQUID, or a magneto-optical sensor. Moreover, the AC modulation voltage may shift the operating frequency of the magnetic sensor. Additionally, each flux concentrator may comprise a structural material layer and magnetic material layer. Furthermore, the structural material layer may comprise at least one of silicon, polysilicon, and silicon-on-insulator (SOI). In addition, the magnetic material layer may comprise at least one of a magnetically soft material and a multilayer stack of a high permeability material and a spacer material. The magnetic material may also comprise single domain magnetic particles and a nonmagnetic material.

Another preferred embodiment herein provides a microelectromechanical system (MEMS) device comprising a semiconductor substrate; a cantilever structure comprising a first end attached to the semiconductor substrate as shown, for example, in FIG. 2C. The magnetic sensor may be attached to the second end; allowing for a continuous variation of an amplification of the magnetic field. The MEMS device receives a DC voltage and an AC modulation voltage; such that the AC modulation voltage shifts the operating frequency of the magnetic sensor such that the magnetic sensor oscillates in a kilohertz range. The signal to be detected is essentially shifted to a higher frequency due to the sensor on the cantilever oscillating in and out of the flux line concentration area between stationary flux concentrators. Stationary platforms, coupled to the semiconductor substrate, may be used to provide support for the flux concentrators that flank the magnetic sensor.

A further embodiment herein provides a method of fabricating a microelectromechanical system (MEMS) device comprising providing a semiconductor wafer; depositing an insulating layer on the semiconductor wafer; depositing a first metal electrode on the insulating layer; depositing a lead zirconate titanate (PZT) layer on the first metal electrode; depositing a second metal electrode on the PZT layer; depositing a magnetic sensor on the second metal electrode; etching the semiconductor layer to create a cantilever structure extending from the semiconductor wafer, wherein the cantilever structure comprises a tip; and removing the magnetic sensor from all parts of the microelectromechanical device except the tip of the cantilever structure.

According to such a method, depositing the PZT layer may comprise using a sol gel technique. Moreover, etching the semiconductor wafer may form a pair of stationary platforms flanking the cantilever structure. In addition, each stationary platform may comprise a flux concentrator. Furthermore, only the cantilever structure may be movable. Additionally, each flux concentrator comprises a structural material layer and a magnetic material layer.

Although the oscillating magnetic sensor may be mounted to a cantilever as described herein, the invention is not limited to the sensor being mounted to a cantilever, as the sensor may be mounted to a variety of oscillating structures without departing from the scope of the present invention. Moreover, although the at least one flux concentrator is described as stationary, the at least one flux concentrator may be subjected to movement relative to the base without departing from the scope of the present invention. The relative movement between the flux concentrator and the sensor is the operative factor which determines the shift in frequency of the sensed magnetic signal.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE SEVERAL VIEWS OF THE DRAWINGS

The embodiments herein will be better understood from the following detailed description with reference to the drawings, in which:

FIG. 2B is a top view schematic diagram of a MEMS cantilever flux concentrator device according to an embodiment herein;

FIG. 2C is a cross-sectional side view schematic diagrams taken along line B-B of FIG. 2B according to an embodiment herein;

FIG. 3A is a cross-section front view of one embodiment of a flux concentrator according to an embodiment herein;

FIG. 3B is a cross-section front view of one layer, taken at cutaway section C, of the flux concentrator of FIG. 3A according to an embodiment herein;

FIG. 3C is a cross-sectional illustration of an embodiment of the present invention showing the flux concentrators of FIG. 3A in combination with the cantilever assembly of FIG. 1H wherein sensor 35 is substantially in alignment with the magnetic flux conducting portion of flux concentrators 42, 44 at the intermediate position during oscillation and FIG. 4 is a flow diagram illustrating a method according to an embodiment herein.

DETAILED DESCRIPTION OF THE INVENTION

Figure 1A:
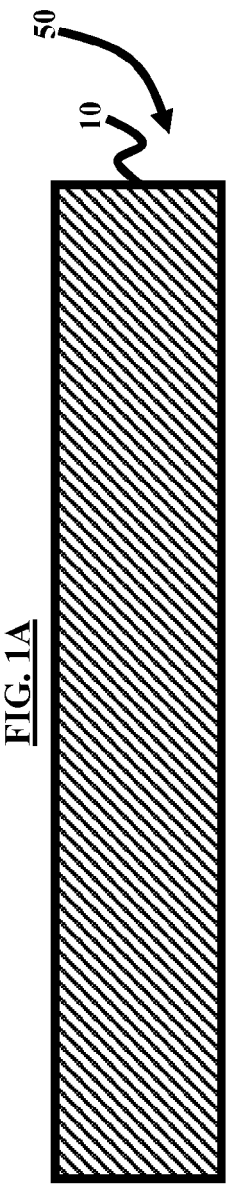
FIG. 1A is a cross-sectional front view schematic diagram illustrating a first step in the fabrication of a MEMS cantilever flux concentrator device according to an embodiment herein.

The embodiments herein, and the various features and advantageous details thereof, are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein include an improved MEMS cantilever flux concentrator, which provides a greater dynamic range of motion to allow for larger modulation and more space for a magnetic sensor. In addition, while conventional flux concentrators are designed to operate within a narrow range of frequencies, embodiments herein provide a MEMS cantilever flux concentrator structure that can have large amplitudes of motion when any frequency is applied thereto. Moreover, the embodiments herein provide robust manufacturing features; for example, sensitive components (e.g., a magnetic sensor, described below) are not exposed to harsh environments (e.g., hydrofluoric acid) during manufacturing and component complexity is reduced, thereby improving efficiency (e.g., a stationary flux concentrator, described below). This, in turn, simplifies the manufacturing of the embodiments described herein. Referring now to the drawings, and more particularly to FIGS. 1A through 4, there are shown preferred embodiments.

Figure 1B:
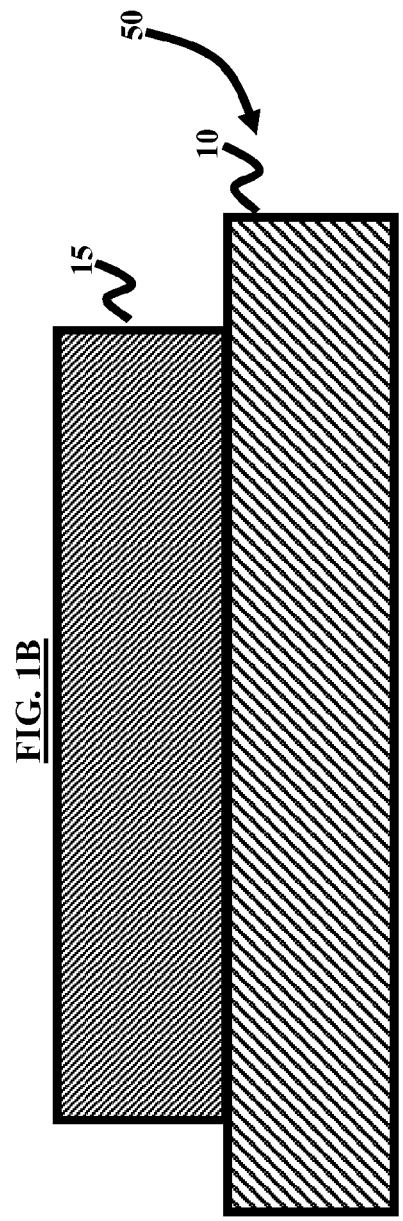
FIG. 1B is a cross-sectional front view schematic diagram illustrating a second step in the fabrication of a MEMS cantilever flux concentrator device according to an embodiment herein.
Figure 1C:
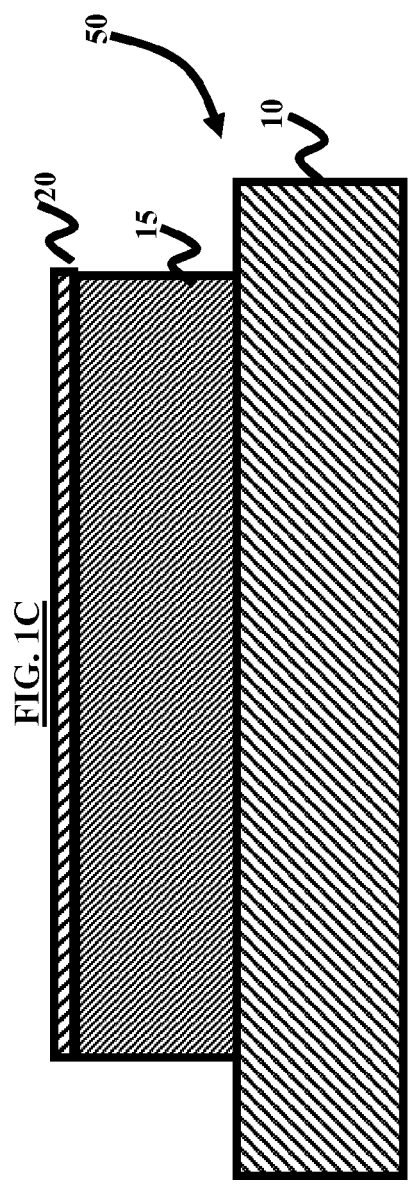
FIG. 1C is a cross-sectional front view schematic diagram illustrating a third step in the fabrication of a MEMS cantilever flux concentrator device according to an embodiment herein.
Figure 1D:
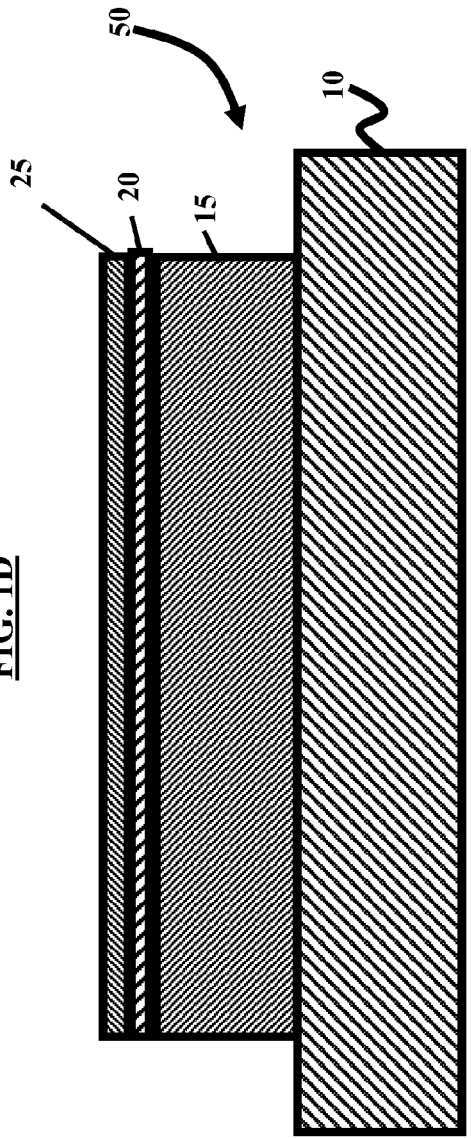
FIG. 1D is a cross-sectional front view schematic diagram illustrating a fourth step in the fabrication of a MEMS cantilever flux concentrator device according to an embodiment herein.
Figure 1E:
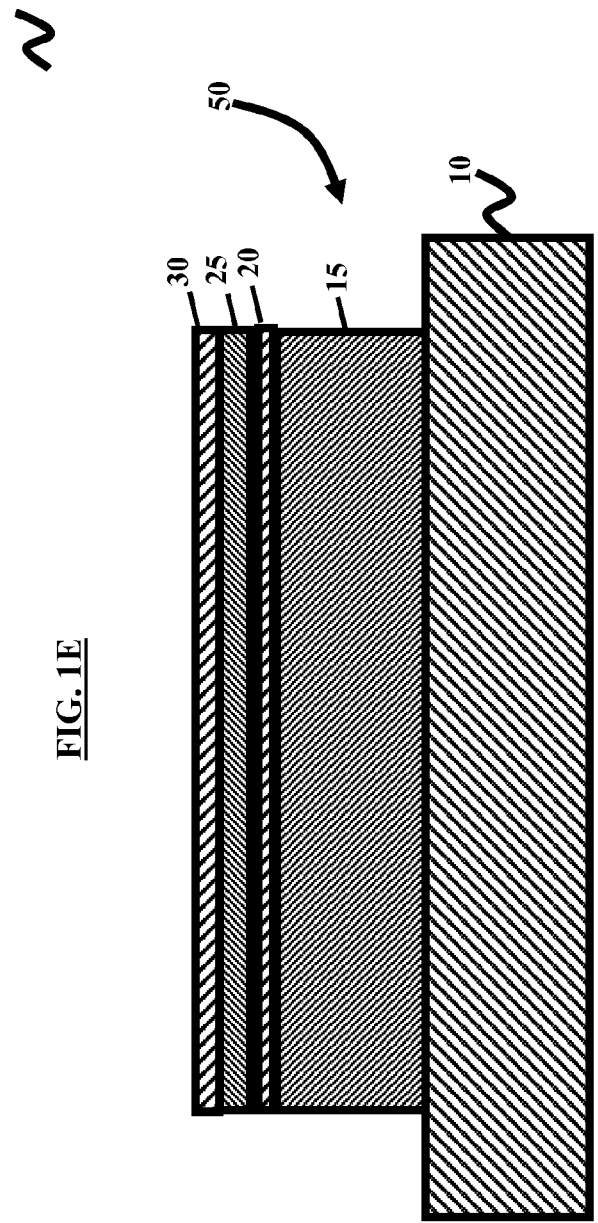
FIG. 1E is a cross-sectional front view schematic diagram illustrating a fifth step in the fabrication of a MEMS cantilever flux concentrator device according to an embodiment herein.
Figure 1F:
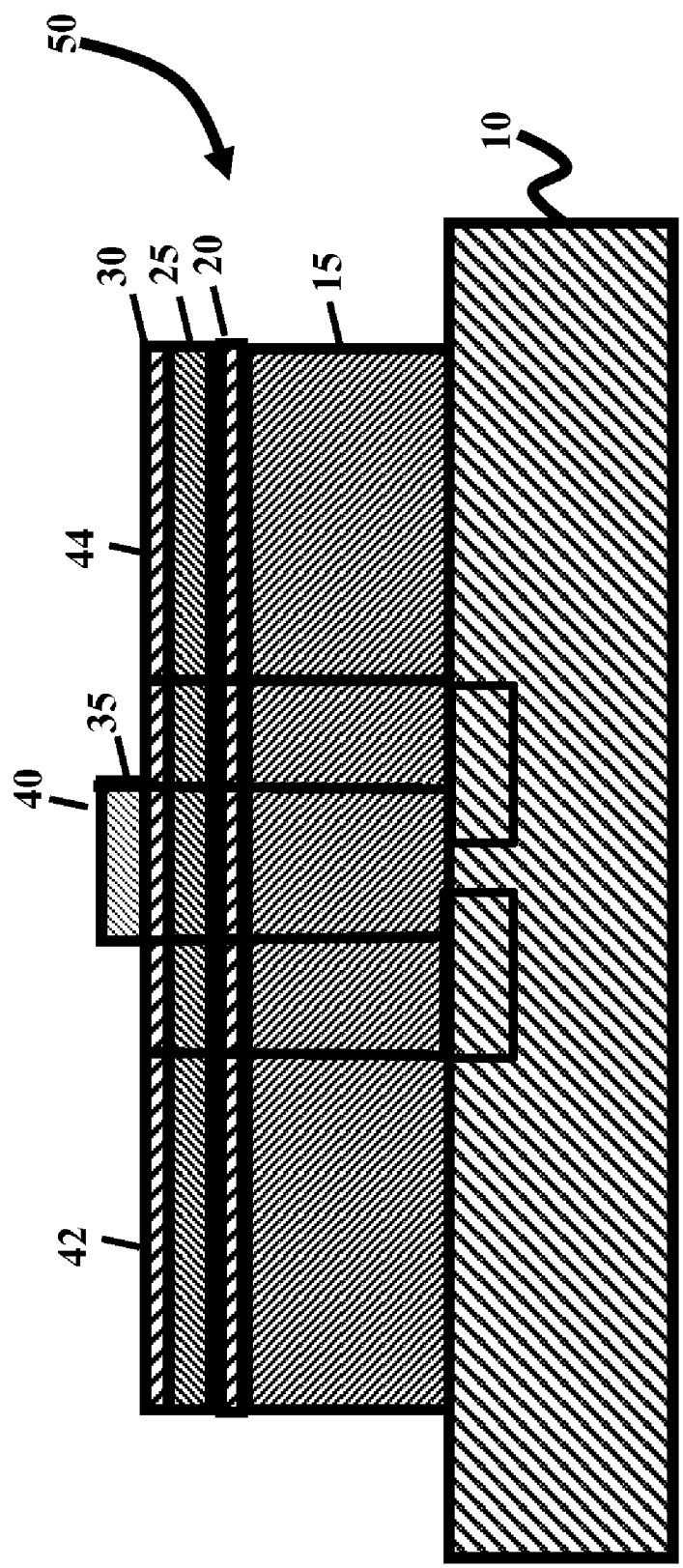
FIG. 1F is a cross-sectional front view schematic diagram illustrating a sixth step in the fabrication of a MEMS cantilever flux concentrator device according to an embodiment herein.

FIGS. 1A through 1F are cross-sectional front view schematic diagrams illustrating a sequence of manufacturing steps for fabricating a MEMS flux concentrator device 50 according to an embodiment herein. The process begins in FIG. 1A with a semiconductor (e.g., silicon (Si)) wafer 10. FIG. 1B illustrates an insulating layer 15 (e.g., silicon oxide (SiO$_2$)) deposited over the wafer 10. FIG. 1C illustrates a first electrode 20 (e.g., a platinum (Pt) electrode) deposited over the insulating layer 15. FIG. 1D illustrates a lead zirconate titanate (PZT) layer 25 deposited over the first electrode 20. FIG. 1E illustrates a second electrode 30 (e.g., a Pt electrode) deposited over the PZT layer 25. FIG. 1F illustrates a magnetic sensor 35 deposited over a portion of the second electrode 30 on the cantilever 40.

The thicknesses of the layers and the relative sizes may vary depending upon application without departing from the scope of the present invention. The various structures of MEMS flux concentrator device 50 illustrated are not shown to scale and the dimensions of the various structures may be exaggerated to better illustrate the relationship between the shown structures.

Figure 1G:
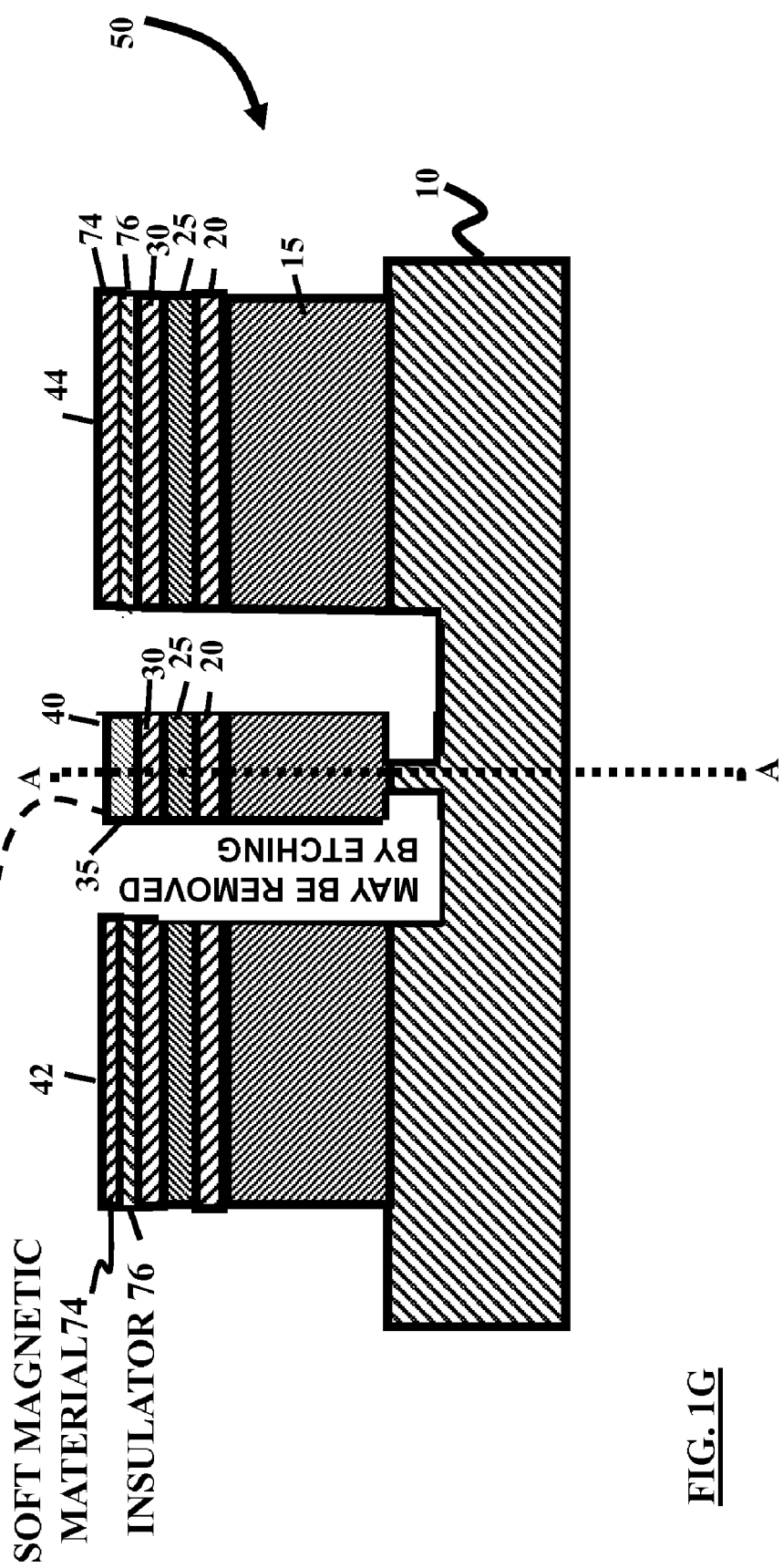
FIG. 1G is a cross-sectional front view schematic diagram after etching a MEMS cantilever flux concentrator device according to an embodiment herein.
Figure 1H:
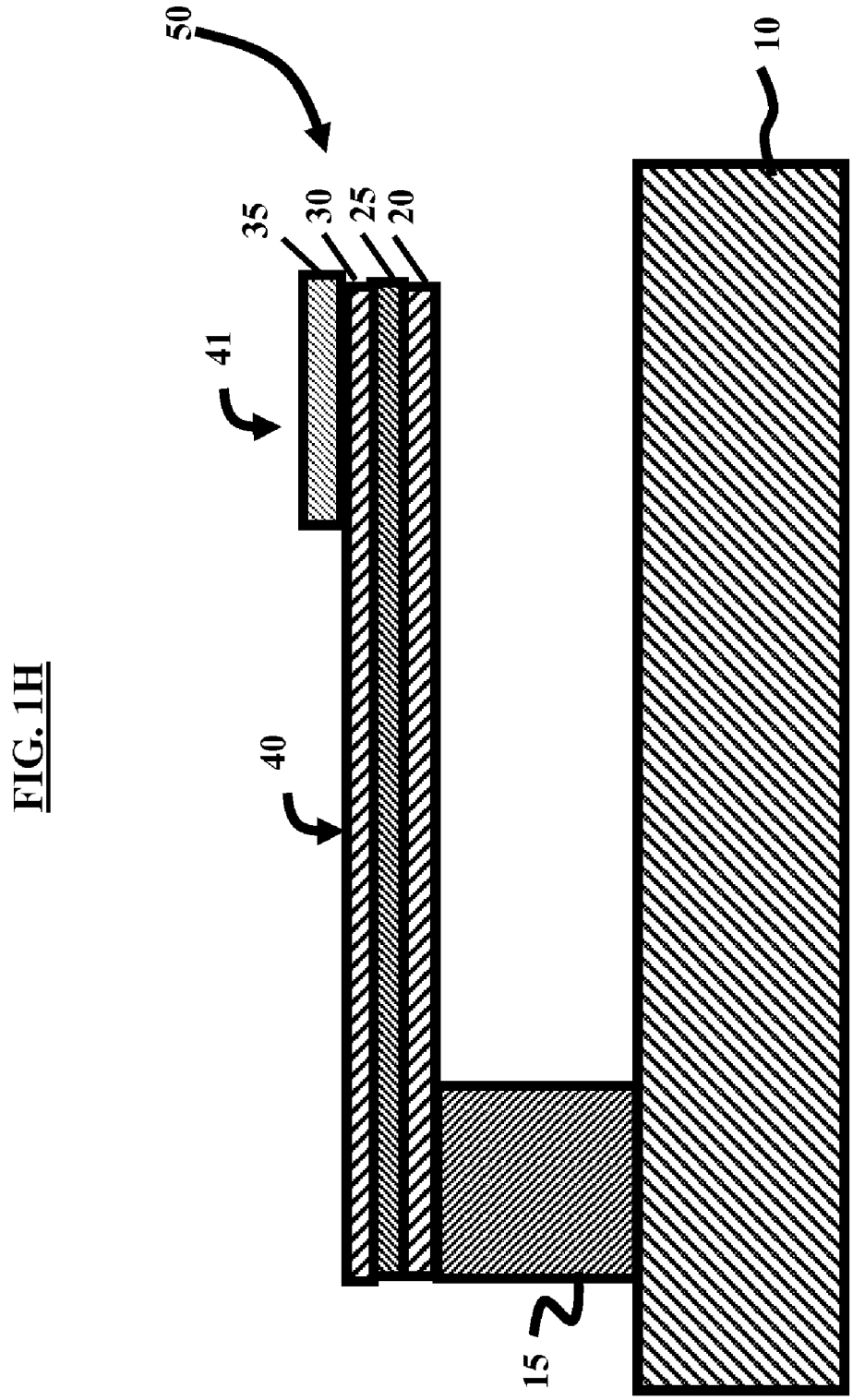
FIG. 1H is a cross-sectional side view schematic diagram of a MEMS cantilever flux concentrator device according to an embodiment herein after cantilever release for a MEMS cantilever flux concentrator device.

FIGS. 1G and 1H are further illustrations of the embodiment of FIGS. 1A through 1F. FIG. 1G illustrates the results of exposing selected portions of the wafer 10 to an etching process, such as the deep-reactive ion-etching (DRIE) process referred to in U.S. Pat. No. 7,655,996, incorporated herein by reference. FIG. 1H illustrates a cross-sectional view schematic diagram of the released MEMS cantilever 40 and sensor (tip) 41, where cantilever structure 40 is released by etching the wafer 10. The MEMS structure is preferably defined using standard lithographic techniques. The process may involve using a deep reactive ion-etching (DRIE) process to remove unwanted portions of the device layers, the absence of which is illustrated in FIG. 1G.

As shown in FIG. 1G, the portions forming the flux concentrators 42, 44, comprise, above contact layer 30, an insulating layer 76 and a soft magnetic material layer 74. The magnetic layer 74 of the flux concentrators 42, 44 are positioned such that when the cantilever 40 is in an intermediate position (i.e., midway between the two farthest positions of oscillatory travel), the magnetic sensor 35 and magnetic layer 74 as substantially in alignment (i.e., as depicted in FIG. 1G, substantially in the same plane that is perpendicular to the surface of the paper).

As shown in FIG. 1H, cantilever 40 may include the followings layers: wafer 10, insulating layer 15, a first electrode 20 layer, PZT layer 25, and a second electrode 30 layer. Sections of the insulating layer 15 has been removed to allow oscillation In addition, tip 41 is a portion of cantilever 40. As shown in FIG. 1H, tip 41 may include a magnetic sensor 35 layer.

Figure 2A:
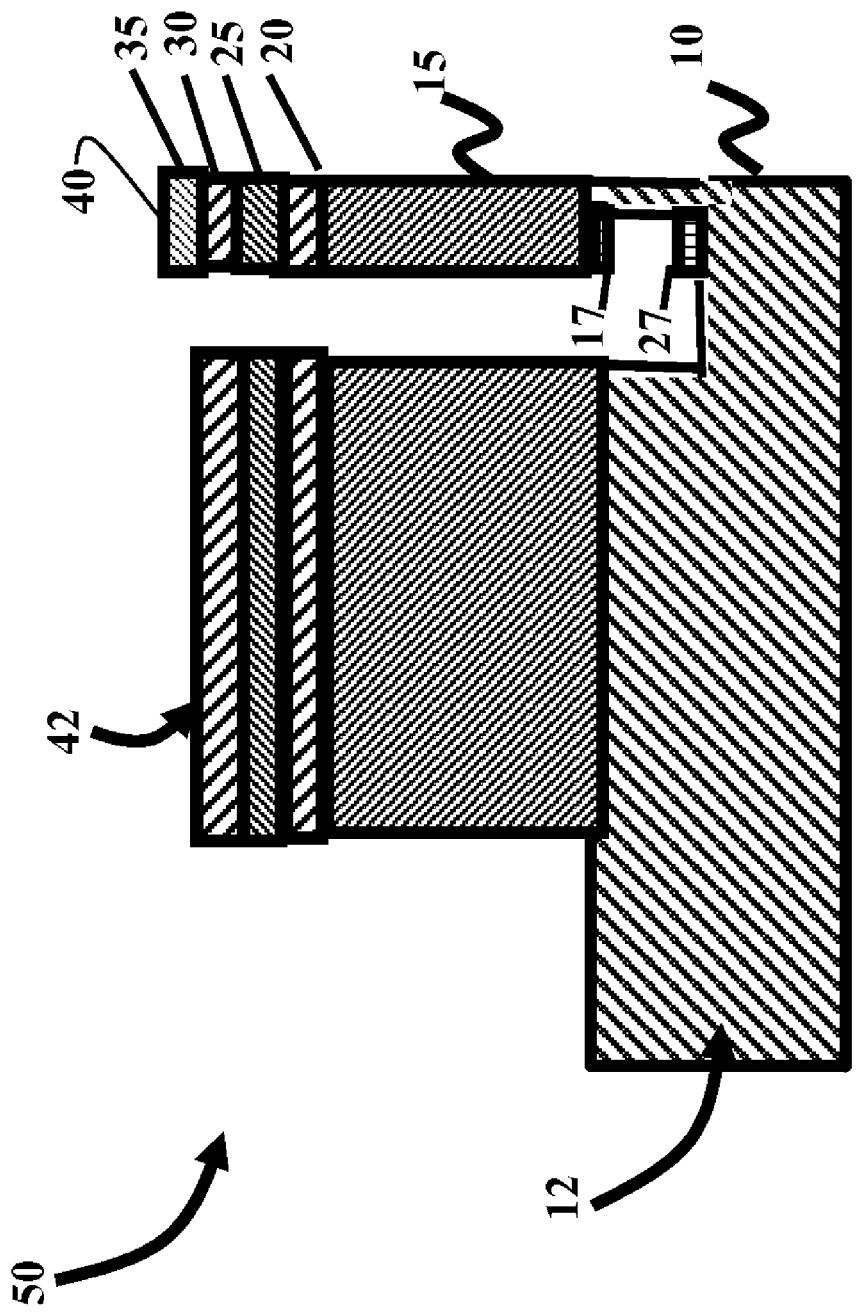
FIG. 2A is a cross-sectional side view schematic diagram taken along line A-A of FIG. 1G according to an embodiment herein.

FIG. 2A illustrates a cross-sectional schematic diagram of MEMS flux concentrator device 50 (cut-away along the A-A axis, shown in FIG. 1G). Material that has been removed according to an etching process (e.g., as shown in FIGS. 1G and 1H) is not shown in FIG. 2A. As shown, MEMS flux concentrator device 50 includes a magnetic sensor 35, coupled to cantilever 40 at tip 41. FIG. 2A also shows flux concentrator 42 (where flux concentrator 42 may be part of the flux concentrator 42, 44 pair, shown in FIGS. 2B and 2C). While not illustrated in detail in FIG. 2A, MEMS flux concentrator 42 can also comprise a thick film of a soft ferromagnetic material with a large magnetic permeability. In a preferred form, magnetic sensor 35 may be formed by films deposition. Moreover, in the embodiment shown in FIG. 2A, flux concentrator 42 is deposited on a stationary silicon platform 12. In the embodiment shown in FIG. 2A, silicon platform 12 is formed from wafer 10.

In a preferred MEMS flux concentrator device 50, magnetic field magnetic sensor 35 may be for example, a Hall-effect device, magnetoresistive or magnetorestrictive type magnetic sensor. Magnetic flux concentrators 42, 44 (shown in FIGS. 2B and 2C) are provided to strengthen the magnetic field at the position of magnetic sensor 35. Accordingly, the concentrated magnetic field is greatest when magnetic sensor 35 is substantially aligned with flux concentrators 42, 44. In one embodiment herein, stationary flux concentrators 42, 44 further includes a deposition of a soft magnetic layer (as described below and shown in FIGS. 3A and 3B).

The dimensions of stationary flux concentrators 42, 44 may have dimensions of approximately 100 by 75 microns, while the thickness of stationary flux concentrator 42 may be approximately 0.1 to 15 micrometers. As shown in FIG. 2A, electrode pads 17 may be deposited underneath cantilever 40. Furthermore, a matching electrode pad 27 may be deposited on substrate wafer 10. Electrical connections to electrode pads 27 may be made by coating wafer 10 (e.g., a silicon substrate) with a conductor (not shown). The electrical connection to bottom electrode pads 17 may also be made by a conductor (not shown). While not shown, electrode pads 17, 27 provide electrical connections that lead to layers 20, 30, respectively. In an alternative embodiment, electrical connection to layers 20, 30 are established by creating contact points (not shown) at the stationary end (pivot fulcrum) of cantilever 40. Additionally, those skilled in the art would understand that other techniques could be used to establish electrical connection to layers 20, 30. Moreover, application of electricity (e.g., an AC voltage) causes cantilever 40 to oscillate at tip 41, as described above.

FIG. 2B, with reference to FIGS. 1A through 2A, illustrates a top view schematic diagram of MEMS cantilever flux concentrator device 50 according to an embodiment herein. In the embodiment shown in FIG. 2B, cantilever 40 is position between stationary flux concentrators 42, 44 such that tip 41 is situated between flux concentrators 42, 44. In that position, magnetic sensor 35 (located on tip 41, as shown in FIG. 1H).

FIG. 2C illustrates is a cross-sectional side view schematic diagrams taken along line C-C of FIG. 2B according to an embodiment herein. In the embodiment shown in FIG. 2C, one end of cantilever 40 immovably affixed to wafer 10, while the portion of cantilever 40 which supports tip 41 is free to oscillate between positions 41a and 41b. The oscillation is driven by the passage of a current waveform though contacts 17, 27 onto electrode layers 20, 30 which produces the movement in a manner know to those of skill in the art. During such oscillations, magnetic sensor 35 (located on tip 41) oscillates between flux lines created between stationary flux concentrators 42, 44 (shown in FIG. 2B).

In the embodiments of MEMS cantilever flux concentrator device 50 shown in FIGS. 2A through 2C, the oscillating motion of cantilever tip 41 is driven electrostatically (e.g., using electrode pads 17, 27) at a frequency, $f_m$, by applying an AC voltage from a signal generator (not shown). In one embodiment herein, driving the motion from the signal generator requires very little power, particularly if the drive frequency is set equal to the mechanical resonant frequency of cantilever 40. Moreover, cantilever tip 41 can have large amplitudes of motion at any frequency applied. By using the resonant frequency, it is possible to obtain the largest amplitudes for the oscillations using the least power. The magnetic field generated by the small currents of the exciting electrostatic modulating signal is negligible.

Magnetic sensor 35 may comprise a Hall-effect device wherein four leads are required. Other types of Hall-effect devices, which typically have a rectangular geometry with current or voltage electrodes arranged on each side of a rectangle, may also be used. It is also possible to use Hall-effect devices in which three or all four electrodes are arranged on one side of the rectangle.

When a Hall-effect device is used, an output voltage from such a device results from the Lorentz force of the magnetic field acting on charge carriers within such a device. Other types of magnetic sensors include fluxgate magnetometers and magnetoresistive sensors that include anisotropic magnetoresistive sensors, giant magnetoresistive sensors, spin dependent tunneling sensors, bismuth sensors, magnetorestrictive sensors, and MEMS sensors, and the like.

When magnetic sensor 35 is a magnetoresistive element, a Wheatstone electrical bridge configuration (not shown) may be used to interface with the magnetic sensor 35. When the resistance of the magnetoresistive element changes because of a magnetic field, the Wheatstone electrical bridge output voltage changes. Using flux concentrators 42, 44 increases the change in the Wheatstone electrical bridge output. The Wheatstone electrical bridge output voltage is modulated at a frequency $2f_m$, typically the resonant frequency of cantilever 40. The signal may then be amplified by a narrow band amplifier and then demodulated. The bandwidth of the amplifier only has to be sufficiently broad to include the low frequencies in the original signal coming into the MEMS cantilever flux concentrator device 50. The range of frequencies should preferably be approximately 1 to 50 kHz. The embodiments herein allow a variation of the amplification of the magnetic field at the position of magnetic sensor 35. Thus, if the field would saturate magnetic sensor 35, the amplification can be decreased. It is not important to vary the amplification continuously, but it is desirable to be able to change the sensitivity in steps. Thus, it is possible to avoid having the signal be too small to detect with a reasonable signal to noise ratio or so large that it saturates the device 50.

Flux concentrators 42, 44 may be constructed in multiple layers. In one embodiment illustrated in FIG. 3A, layers of flux concentrator 42, 44 may comprise a hard magnetic material (having a coercivity greater than 50 Oersteds) layer 72 and a soft magnetic material (having a coercivity less than 5 Oersteds) layer 74 with equal magnitude magnetizations separated by a spacer layer 76. Spacer layer 76 may comprise a nonmagnetic material, such as aluminum or silicon dioxide. The structure of layers 72, 74, and 76 may be constructed as described in detail in U.S. Pat. No. 7,046,002, the complete disclosure of which, in its entirety, is herein incorporated by reference.

FIG. 3B is a cross-section front view of soft magnetic material layer 74, taken at cutaway section C, of the flux concentrators 42, 44 of FIG. 3A according to an embodiment herein. As illustrated in FIG. 3B, soft magnetic material layer 74 (e.g., at cutaway section C) may comprise a composite of single domain magnetic particles 78 and a nonmagnetic material 80. Single domain magnetic particles 78 and a nonmagnetic material 80 are discussed in detail in U.S. Pat. No. 7,046,002, which is incorporated in its entirety by reference. As discussed therein, by restricting magnetic materials to be composed of single domain particles 78, the magnetization within such materials can only change by domain rotation and not domain wall motion. Particles of a soft ferromagnetic material (such as Permalloy nickel, which is approximately 80 atomic percent iron and 20 atomic percent Permalloy) which are roughly larger than 10 nm and smaller than approximately 50 nm will be single domain and not superparamagnetic.

FIG. 3C is a cross-sectional illustration of an embodiment of the present invention showing the flux concentrators of FIG. 3A in combination with the cantilever assembly of FIG. 1H wherein sensor 35 is substantially in alignment with the magnetic flux conducting portion of flux concentrators 42, 44 at the intermediate position during oscillation.

The volume fraction of single domain magnetic particles 78 to the nonmagnetic material may be up to approximately 50%. Domain rotation generates much less noise compared to domain wall motion. Moreover, it is still desirable that the magnetizations of the soft magnetic material and the hard magnetic material cancel in the absence of an external field.

A design may be used wherein the edges of flux concentrators 42, 44 are modified to decrease the magnetic noise by treating the edges of the soft magnetic material of flux concentrators 42, 44 so that they have slightly higher coercivity than the center. This improves the magnetic response. The rest of MEMS cantilever flux concentrator device 50 preferably includes a similar three-layer structure with similar arrangement of the magnetizations as described above. The directions of the magnetization may be obtained by processing the flux MEMS cantilever flux concentrator device 50 in a magnetic field.

As mentioned, one embodiment herein achieves displacements by oscillating cantilever structure 40 between flux concentrators 42, 44. When magnetic sensor 35 is above or below the plane of the flux concentrators 42, 44, the enhancement is decreased at the position of magnetic sensor 35. By doing so, the change in sensitivity of magnetic sensor 35 to an external field may be varied by as much a factor of twenty. The sensitivity can be calibrated using a known magnetic field that can be part of the magnetic sensor 35. It is desirable to control the sensitivity so that the signal noise ratio is good or that magnet sensor 35 is not saturated.

The embodiments herein allow for a variable gain to increase the dynamic range by applying a DC voltage. In addition, applying an AC modulation voltage at a frequency $f_m$ modulates the signal seen by the sensor at $2f_m$. This has the effect of shifting the low frequency signal of interest to higher frequencies where the 1/f noise is smaller.

Driving the motion from the signal generator requires very little power, particularly if the drive frequency is set equal to the mechanical resonant frequency of the cantilever 40. By using the resonant frequency, one obtains the largest amplitudes for the oscillations using the least power. The magnetic field generated by the small currents of the exciting electrostatic modulating signal is negligible. Magnetic sensor 35 may comprise a Hall-effect device wherein four leads are required. Other types of Hall effect devices, which typically have a rectangular geometry with current or voltage electrodes arranged on each side of a rectangle, may also be used. It is also possible to use Hall devices in which three or all four electrodes are arranged on one side of the rectangle. See, e.g., Falk et al., U.S. Pat. No. 5,057,890, issued Oct. 15, 1991, the complete disclosure of which is herein incorporated by reference.

The embodiments described herein are preferably fabricated by MEMS processing techniques. Such techniques are addressed by LIGA (Lithographie, Galvanoformung, Abformung, for "lithography, electroplating, molding") micromachining processing methods that use metals, polymers and even ceramics for the production of varied microstructured devices having extreme precision. These collective microstructures are referred to as MEMS-type devices, which are alternatives to conventional discrete electromechanical devices such as relays, actuators, and sensors. When properly designed, MEMS-type devices produce useful forces and displacement, while consuming reasonable amounts of power.

Current LIGA processes create features whose top surface is as much as 200-microns above the substrate. Any technology may be used to form the device 50, whether a LIGA-type process or a bulk plasma micromachining technique such as reactive ion etching (RIE), or a surface micromachining technique using standard photolithography and etching processes yielding the desired configurations. Preferably, each MEMS flux concentrator device 50 is fabricated on a die, which in an extreme case might be as large as one square centimeter, but is more likely to be less than on square millimeter in area and approximately 0.5 to 50 microns thick.

In addition, each device 50 may be implemented on a single silicon chip or die, but multiple dies may also be used. In a preferred embodiment, the device 50 is monolithic in its basic configuration. MEMS devices may be readily integrated and interfaced with electronics because they are fabricated much the same way as integrated circuits. The specific MEMS fabrication technique requires only desired geometries and mechanical and electrical performance characteristics are obtained.

FIG. 4, with reference to FIGS. 1A through 3B, is a flow diagram illustrating a method of fabricating a MEMS device 50 according to an embodiment herein. In the method shown in FIG. 4, step 100 describes providing a wafer 10 (e.g. a silicon (Si) wafer). Step 102 describes depositing an insulating layer 15 (e.g., an insulating layer of silicon oxide ($SiO_2$)). Step 104 describes depositing a first electrode 20 (e.g., a Pt electrode). Step 106 describes depositing the cantilever 40 (e.g., cantilever 40 by depositing PZT 25 according to a sol gel technique, for example). Step 108 describes depositing a second electrode 30 (e.g., a Pt electrode). Step 110 describes depositing a magnetic sensor 35. Step 112 describes exposing selected portions of the wafer 10 by etching. In step 114, the method of FIG. 4 describes releasing cantilever 40 by etching the wafer 10. While etching, possible enchants include Sulfur hexafluoride ($SF_6$) and xenon difluoride ($XeF_2$), among other suitable etchants and techniques.

As used herein the terminology 1/f noise means the same as Flicker noise, which is a signal or process with a frequency spectrum that lessens at higher frequencies; and/or pink noise.

As used herein, the terminology "cantilever" means either (A) a projecting structure, such as a beam, that is supported at one end and carries a load at the other end or along its length, or (B) a member, such as a beam, that projects beyond a fulcrum and is supported by a balancing member or a downward force behind the fulcrum.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A microelectromechanical system (MEMS) device for sensing a magnetic field comprising:
a base;
a cantilever attached to the base structure at a first end and movable at a second end, the second end oscillating at a predetermined frequency upon application of a current;
magnetic sensor attached to the movable second end;
at least one flux concentrator mounted on the base adapted to transfer magnetic flux to the sensor;
whereby when the current is applied, the oscillation of the cantilever causes the sensor to oscillate between the lines of flux transferred from the at least one flux concentrator resulting in the shift of the frequency of the sensed magnetic field to the predetermined frequency.

2. The MEMS device of claim 1, wherein the base, cantilever, magnetic sensor and at least one flux concentrator are integral and formed by a deposition possess, and wherein the shift in frequency of the sensed magnetic field operates to reduce the effect of 1/f noise.

3. The MEMS device of claim 2 wherein the cantilever is formed by an etching process.

4. The MEMS device of claim 1 wherein the cantilever comprises first and second contact layers with a piezoelectric layer therebetween; and wherein an electric current is applied to the first and second contact layers, the second end of the cantilever oscillates.

5. The MEMS device of claim 4 wherein the flux concentrators are stationary relative to the oscillating sensor which is positioned such that the sensor is nearest to the at least one flux concentrator at an intermediate position during the oscillation of the sensor, such that the sensor oscillates into and out of the flux lines transferred from the at least one flux concentrator.

6. The MEMS device of claim 5 wherein the sensor is adapted to detect a signal of interest and wherein the second end of the cantilever oscillates in the kilohertz range, resulting in a shifting of the signal of interest into the kilohertz range.

7. The MEMS device of claim 4 wherein the first and second contact layers receive a DC voltage and an AC modulation voltage and wherein the AC modulation voltage shifts the operating frequency of the magnetic sensor.

8. The MEMS device of claim 5 wherein the magnetic sensor oscillates in and out of flux lines created between a pair of stationary flux concentrators.

9. The MEMS device of claim 7, wherein the DC voltage is between 5 and 15 volts.

10. The MEMS device of claim 1, wherein the magnetic sensor comprises one of a Hall-effect type sensor, a magnetoresistive sensor, a MEMS sensor, a magneto-diode, a magneto-transistor, a MAGFET, a fluxgate, a miniature fluxgate magnetometer, a SQUID, and a magneto-optical sensor.

11. The MEMS device of claim 10, wherein the at least one flux concentrator comprises at least one of silicon, polysilicon, and silicon-on-insulator (SOI) layer and a magnetic material layer comprising at least one of a magnetically soft material and a multilayer stack of a high permeability material and a spacer material.

12. A microelectromechanical system for sensing an electromagnetic signal comprising:
a base;
a support which oscillates relative to the base;
a magnetic sensor operatively associated with the support and operable for sensing a magnetic field; the support being driven by an AC modulation voltage to provide for oscillation of the magnetic sensor between first and second positions, wherein the AC modulation voltage shifts the operating frequency of the magnetic sensor to increase the operating frequency to eliminate 1/f-type noise, where f is a frequency of operation of the magnetic sensor;
at least one flux concentrator operatively associated with the magnetic sensor positioned such that when the at least one flux concentrator and the magnetic sensor are substantially located in the same plane, the magnetic sensor is at an approximate intermediate position relative to the first and second positions.

13. The system of claim 12 wherein the magnetic sensor comprises one of a Hall effect type sensor, a magnetoresistive sensor, a MEMS sensor, a magneto-diode, a magnetotransistor, a MAGFET, a fluxgate, a miniature fluxgate magnetometer, a SQUID and a magneto-optical sensor and the at least one flux concentrator comprises a layer of a hard magnetic material, a spacer layer, and a layer of a soft magnetic material, wherein the layer of soft magnetic material comprises single domain magnetic particles and a nonmagnetic material, wherein a coercivity of the hard magnetic material is greater than approximately 50 Oersteds and a coercivity of the soft magnetic material is less than approximately 3 Oersteds, and wherein a volume fraction of single domain magnetic particles to nonmagnetic material is less than or equal to approximately fifty percent.

14. The MEMS device of claim 4 wherein the piezoelectric layer comprises lead zirconate titanate.

* * * * *